United States Patent

North et al.

[11] Patent Number: 5,748,445
[45] Date of Patent: May 5, 1998

[54] HEAT SINK AND CIRCUIT ENCLOSURE FOR HIGH POWER ELECTRONIC CIRCUITS

[75] Inventors: Michael John North; Christopher Hall; Thomas Mark Cyster, all of Taipei; Chris C. Chen, Keelung, all of Taiwan

[73] Assignee: General Resources Corporation, Taipei, Taiwan

[21] Appl. No.: 697,702

[22] Filed: Aug. 27, 1996

[51] Int. Cl.[6] .................................................. H05K 7/20
[52] U.S. Cl. .................... 361/697; 174/16.3; 165/185; 361/721
[58] Field of Search ................... 363/141; 174/16.3; 165/80.3, 185, 122–126; 454/184; 257/721, 722; 361/676–678, 784, 785, 717–721, 703–710, 690, 694, 695, 697

[56] References Cited

U.S. PATENT DOCUMENTS

| | | | |
|---|---|---|---|
| 3,774,078 | 11/1973 | Martin | 317/100 |
| 4,122,508 | 10/1978 | Rumbaugh | 361/384 |
| 4,177,499 | 12/1979 | Volkmann | 361/388 |
| 4,459,638 | 7/1984 | Brehm et al. | 361/384 |
| 4,557,225 | 12/1985 | Sagues | 123/41.31 |
| 4,594,643 | 6/1986 | Hermann | 174/16.3 |
| 4,756,473 | 7/1988 | Takemae et al. | 236/49 |
| 4,994,937 | 2/1991 | Morrison | 361/386 |
| 5,132,780 | 7/1992 | Higgins, III | 357/81 |
| 5,170,336 | 12/1992 | Getter et al. | 363/141 |
| 5,297,025 | 3/1994 | Shoquist | 361/704 |
| 5,311,928 | 5/1994 | Martin | 165/803 |
| 5,406,451 | 4/1995 | Korinsky | 361/697 |

FOREIGN PATENT DOCUMENTS

| 8200344 | 2/1982 | European Pat. Off. | 165/185 |
|---|---|---|---|
| 8505756 | 12/1985 | European Pat. Off. | 174/16.3 |

*Primary Examiner*—Gerald P. Tolin
*Attorney, Agent, or Firm*—George O. Saile; Stephen B. Ackerman

[57] ABSTRACT

This invention describes a triangular heat sink and circuit enclosure for high power dissipation electronic circuits. The heat sink uses a number of cooling fins to provide cooling of the circuitry and equipment contained in the circuit enclosure and can handle power dissipation levels of up to 15 kilowatts. The circuit enclosure uses air moving devices and triangular heat sinks to provide both conduction cooling and heat transfer to a stream of air. The cooling fins of the heat sink are sealed away from the electronic components when the circuit enclosure is assembled.

15 Claims, 8 Drawing Sheets

HEAT SINK AND CIRCUIT ENCLOSURE FOR HIGH POWER ELECTRONIC CIRCUITS

BACKGROUND OF THE INVENTION

(1) Field of the Invention

This invention relates to a heat sink and circuit enclosure for high power dissipation electronic circuits and more particularly to a triangular heat sink which fits in a corner of a circuit enclosure which will provide cooling for the circuitry and equipment contained in the circuit enclosure.

(2) Description of Related Art

Electronic circuitry must be contained in an enclosure which is both economical and functional. In circuitry where power levels are high, such as in the kilowatt range, cooling of the circuitry is of critical importance. The enclosure must provide for easy serviceability of the circuitry and equipment contained in the enclosure. The invention disclosed by this patent application provides an enclosure which provides cooling easy serviceability of the circuitry and equipment contained in the enclosure.

U.S. Pat. No. 5,170,336 to Getter et al. shows an enclosure for a DC to AC inverter using forced air and an external heat sink.

U.S. Pat. No. 5,311,928 to Marton shows an enclosure having a triangular external heat sink.

U.S. Pat. No. 4,756,473 to Takemae et al. shows an enclosure using forced air without heat sinks.

U.S. Pat. No. 4,122,508 to Rumbaugh, U.S. Pat. No. 4,459,638 to Brehm et al., and U.S. Pat. No. 5,406,451 to Korinsky show electronic circuit boards in an enclosure using fans and heat sinks on the circuit boards for cooling.

U.S. Pat. No. 4,994,937 to Morrison shows electronic circuit board mountings in a cooled box structure.

U.S. Pat. No. 5,132,780 to Higgins, III shows a circular type heat sink for cooling electronic circuit packages.

This invention teaches a circuit enclosure which uses a triangular heat sink as an integral part of the enclosure. The heat sink combines both conduction cooling and heat transfer to a stream of forced air using fans internal to the enclosure. The enclosure provides for easy serviceability of the circuitry and equipment contained in the circuit enclosure.

SUMMARY OF THE INVENTION

Electronic circuitry must be contained in an enclosure and cooled. The enclosure must perform the functions of electrical shielding and grounding as well as cooling the electronic circuitry and components within the enclosure. For high power circuits such as power supplies, power converters, motor speed controls, and the like the cooling demands on the enclosure are particularly important.

It is an objective of this invention to provide a heat sink using cooling fins to provide both convection and conduction cooling of electronic circuits.

It is a further objective of this invention to provide a circuit enclosure for electronic circuits which will provide the functions of electrical shielding and grounding as well as providing cooling for the circuits within the circuit enclosure.

These objectives are achieved using a heat sink with cooling fins having a triangular cross section which fits into a corner of a circuit enclosure. Circuit boards with particularly high power dissipation can be mounted directly on one surface of the heat sink to achieve maximum cooling efficiency. The heat sink fits into a circuit enclosure so that the cooling fins are sealed away from the part of the enclosure containing the electronic circuits and devices. The heat sink provides conduction cooling of the circuits as well as convection cooling provided by air flow past the cooling fins.

The circuit enclosure uses one or more air moving devices, such as fans, to force air past the cooling fins. Smaller enclosures use one triangular heat sink and larger enclosures with more power dissipation use two heat sinks. The triangular cross section of the heat sinks makes adding heat sinks easy and economical. A number of side panels and end panels form the outer covering of the enclosure. A control panel controlling the circuitry contained in the enclosure is attached to one of the side panels or end panels. Corner posts and end posts are used to hold the heat sinks in place and to provide structural strength of the enclosure. Mounting brackets can be attached to the end posts for mounting the circuit enclosure.

DESCRIPTION OF THE PREFERRED EMBODIMENTS

Figure 1A:
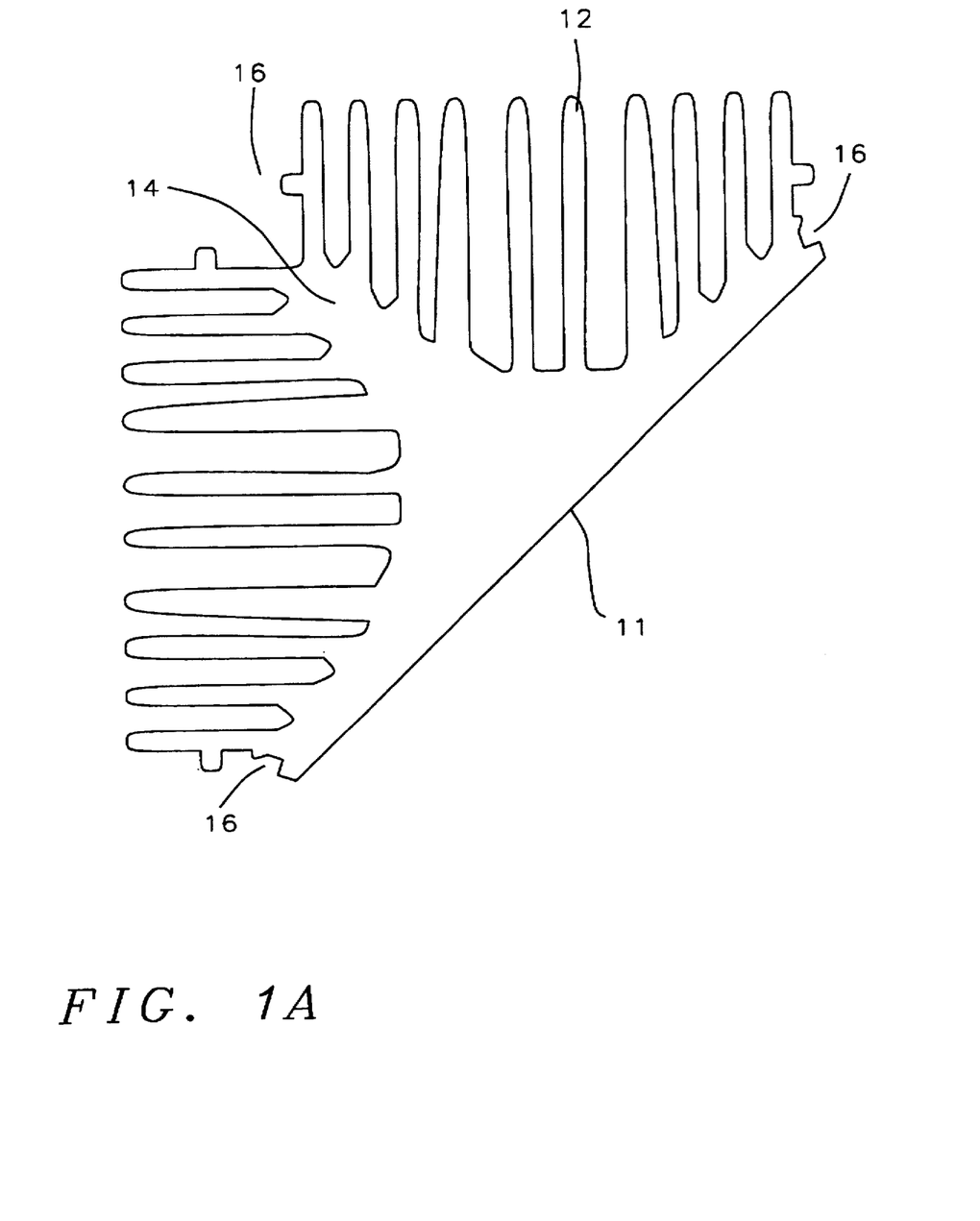
FIG. 1A shows a cross section view of one type of heat sink.
Figure 1B:
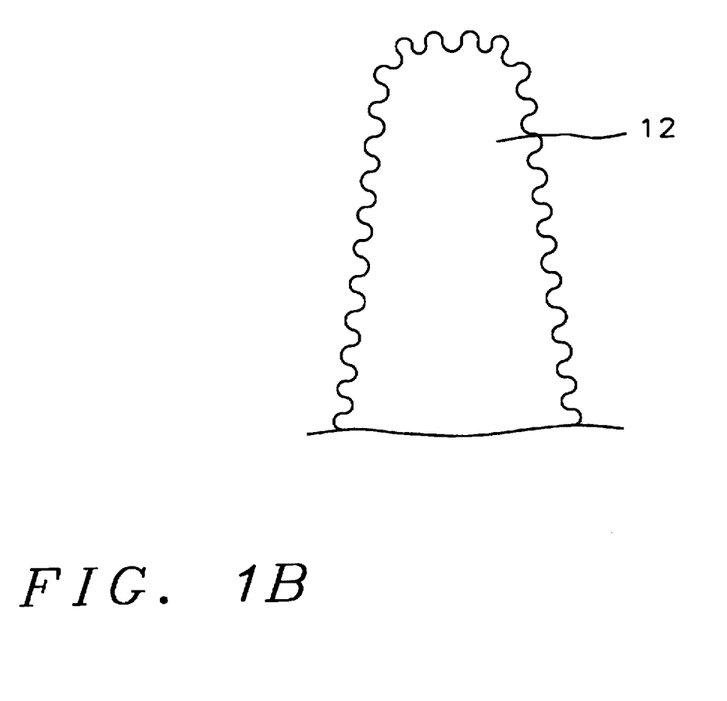
FIG. 1B shows a detailed view of one of the cooling fins.

Refer now to FIGS. 1A and 1B, there is shown an embodiment of the heat sink having a triangular cross section of this invention. The heat sink has a spine 14 and a first surface 11. A number of cooling fins 12 emanate from the spine. The surface of the cooling fins is irregular, as shown in FIG. 1B, to enhance the heat transfer capability of the cooling fins. The first surface 11 of the heat sink can be used to mount circuit boards having particularly high heat dissipation. The heat generated by the circuit board is conducted into the heat sink and conducted away or transferred to surrounding air by the cooling fins 12. The three corners 16 of the heat sink are formed to be attached to either center posts or corner posts of a circuit enclosure. The heat sink is formed of a metal having good heat conduction such as aluminum.

Figure 1C:
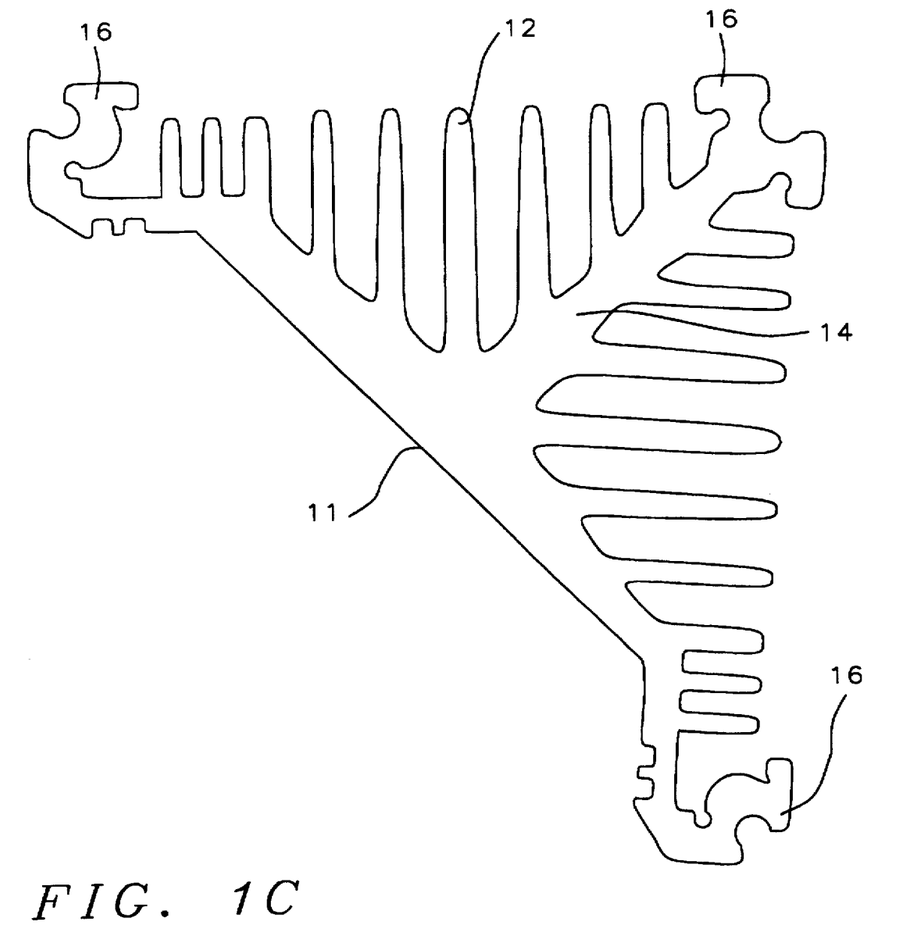
FIG. 1C shows a cross section view of a second type of heat sink.
Figure 1D:
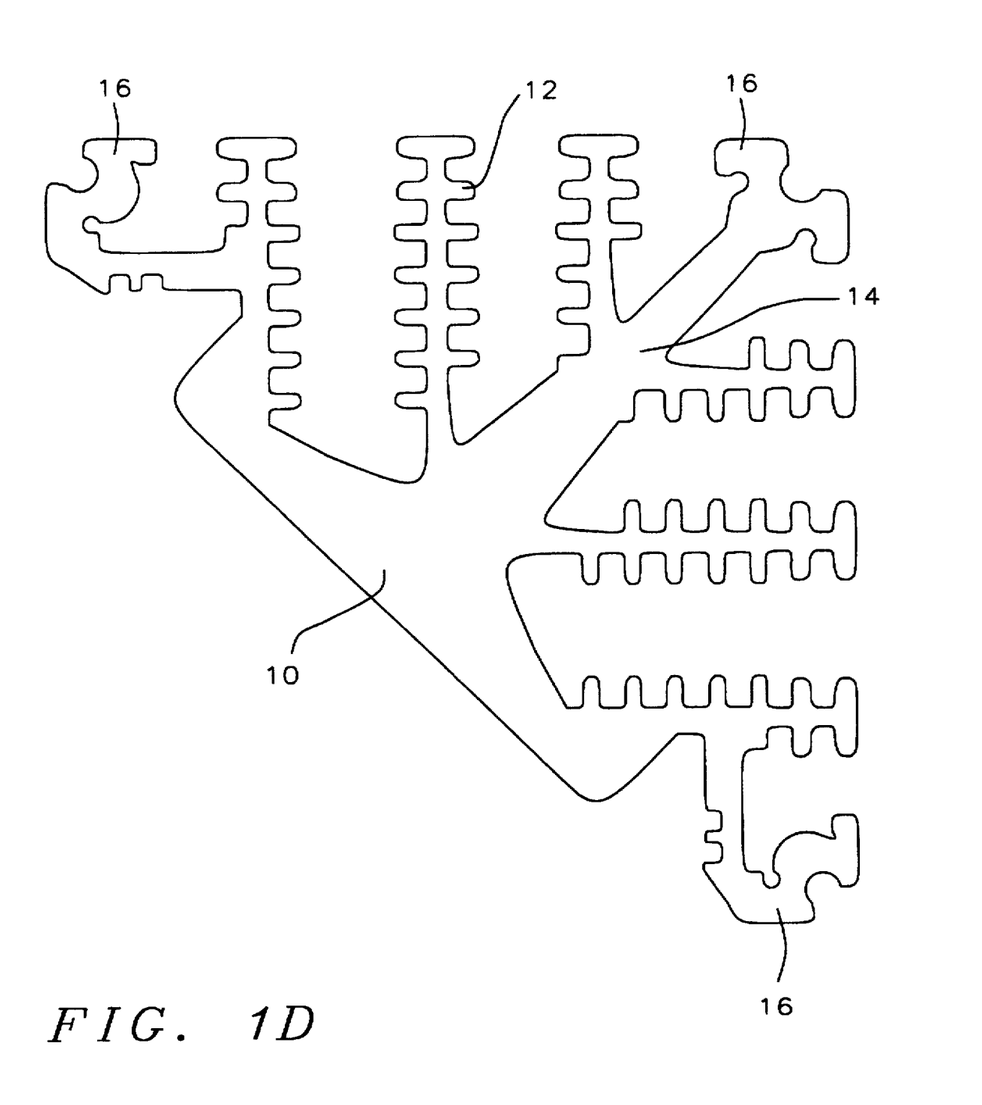
FIG. 1D shows a cross section view of a third type of heat sink.

FIGS. 1C and 1D show the triangular heat sink of this invention having different arrangements of cooling fins 12. The cooling fins 12 emanate from a spine 14 and the first surface 11 of the heat sink can be used for mounting a circuit board as before. The three corners 16 of the heat sinks are adapted to attach the heat sink to the circuit enclosure.

Figure 2:
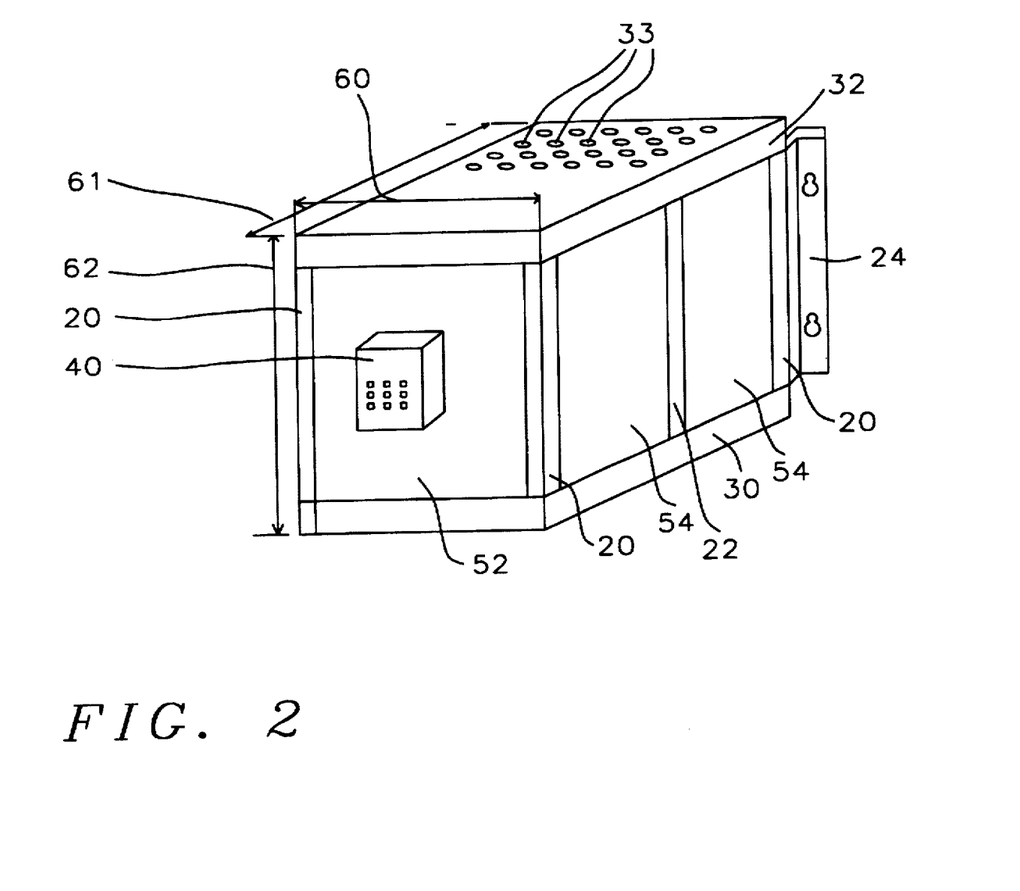
FIG. 2 shows a perspective view of the circuit enclosure.

Refer now to FIGS. 2–7, there is shown an embodiment of the circuit enclosure of this invention. FIG. 2 shows a perspective view of the circuit enclosure having four corner posts 20 and two center posts 22. The circuit enclosure has a top 32 and a bottom 30 and has louvers 33 in the top and bottom to allow air to pass in and out of the circuit enclosure. End panels 52 are attached to two corner posts 20 and side panels 54 are attached to one corner post 20 and one center post 22. A control panel 40 is shown attached to one of the end panels 52 but can be attached to an end panel 52 or a side panel 54. A mounting bracket 24 is attached to one of the corner posts and can be used to mount the circuit enclosure as desired.

The circuit enclosure has a width 60 of between about 120 and 180 millimeters and a length 61 of between about 240 and 360 millimeters. The height 62 of the circuit enclosure depends on the power dissipated in the circuit enclosure and is between about 250 and 550 millimeters. The circuit enclosure of this example is used for a motor speed controller and has an input voltage of 220/440 volts. The circuit enclosure may be used for other applications and input voltages.

Figure 3:
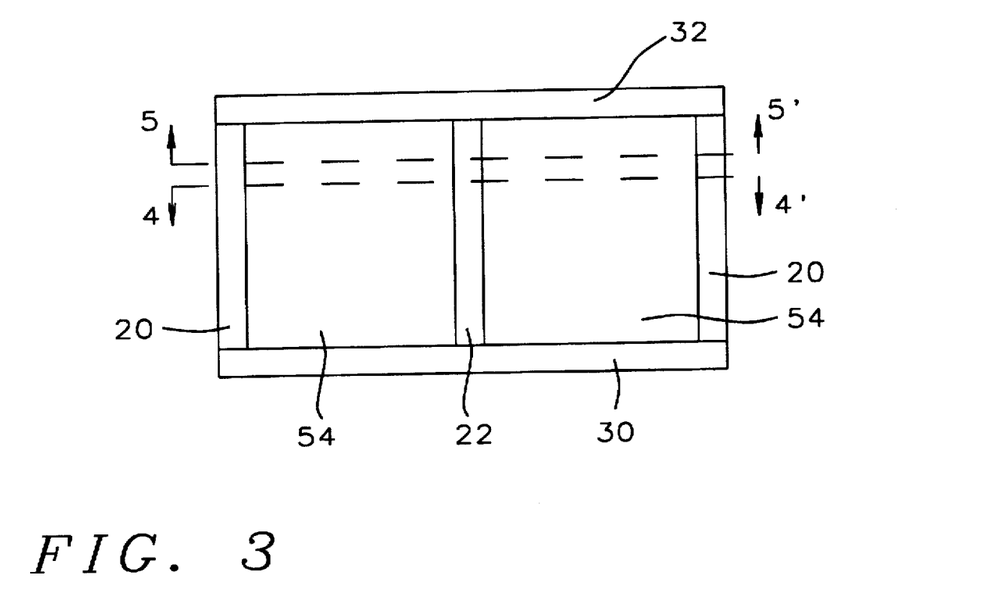
FIG. 3 shows a side view of the circuit enclosure.
Figure 4:
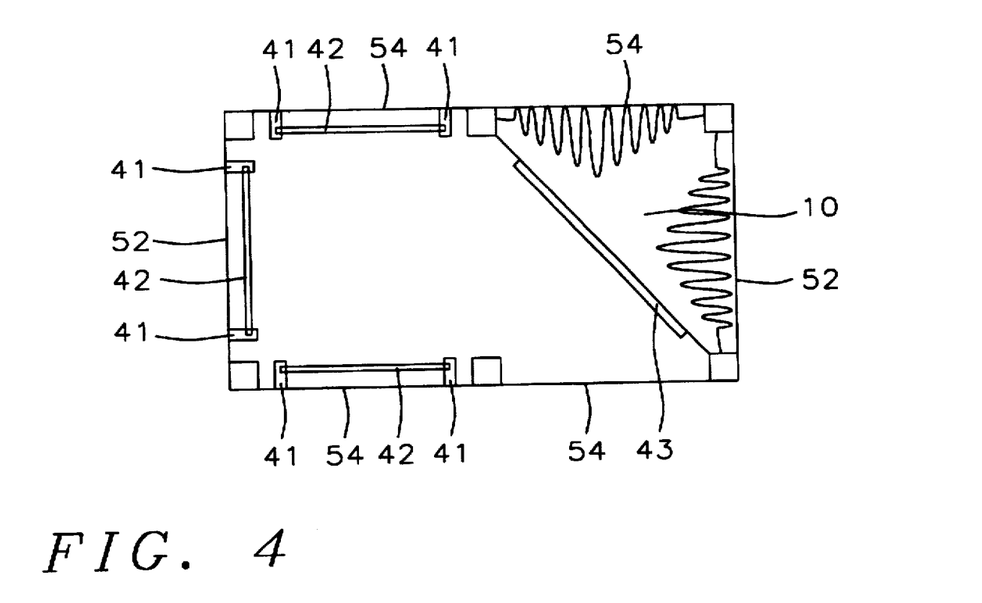
FIG. 4 shows a cross section view of the circuit enclosure along the line 4-4' of FIG. 3 showing the heat sink.
Figure 5:
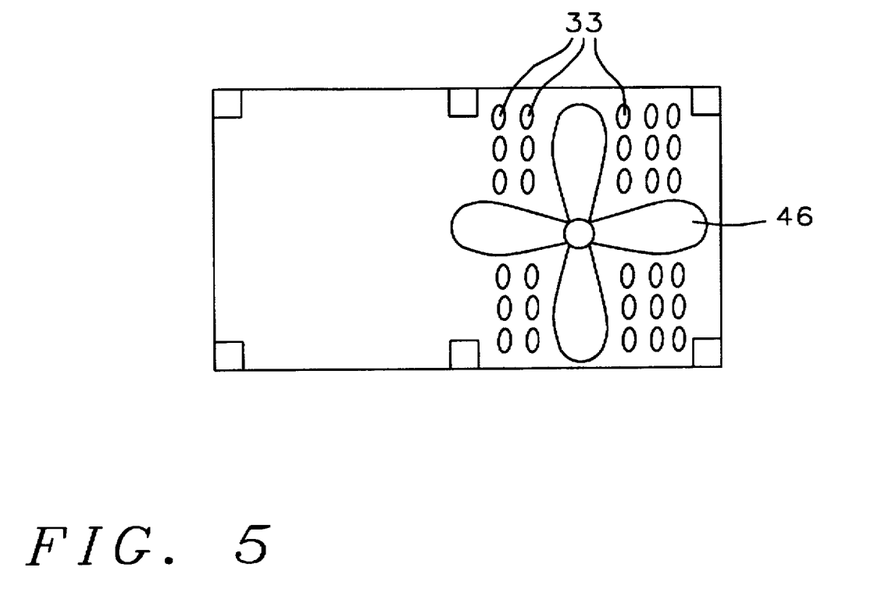
FIG. 5 shows a cross section view of the circuit enclosure along the line 5-5' of FIG. 3 showing the air moving device.

FIG. 3 shows a side view of the circuit enclosure showing the top 32, bottom 30, corner posts 20, center post 22, and side panels 54. FIG. 4 shows a cross section view of the circuit enclosure along line 4–4' of FIG. 3. As shown in FIG. 4 the heat sink 10 fits in one end of the enclosure and is attached to two corner posts 20 and one center post 22. The side panels 54 and end panels 52 enclose the circuit enclosure. FIG. 5 shows a cross section view of the circuit enclosure along line 5–5' of FIG. 3. As shown in FIG. 5 an air moving device 46, in this example a fan, is located in the top of the enclosure and forces air past the cooling fins of the heat sink.

Figure 6:
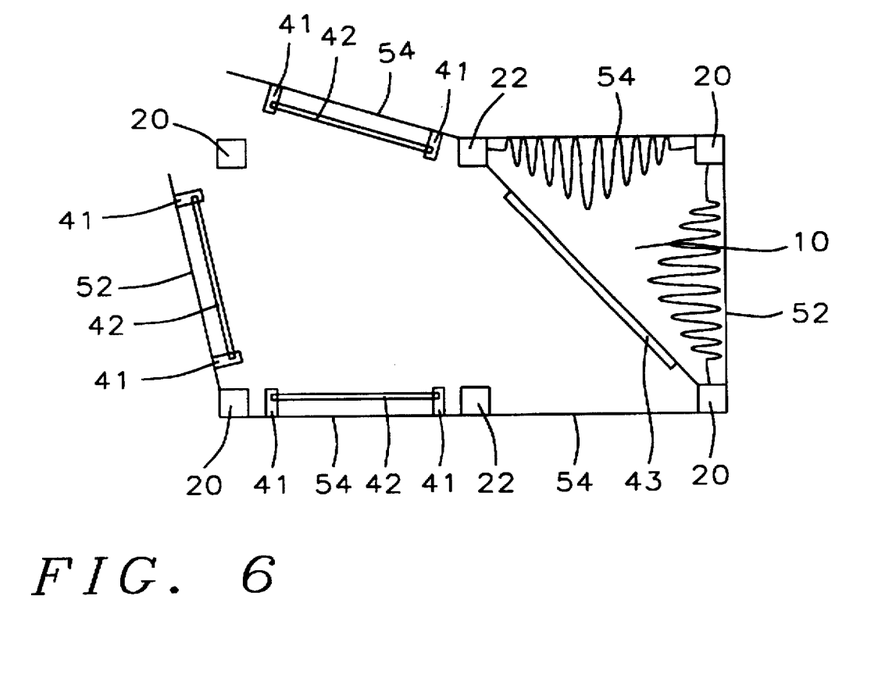
FIG. 6 shows a cross section view of the circuit enclosure showing the flexibility in opening the enclosure for servicing.

As shown in FIG. 4 the heat sink 10 is attached to two corner posts 20 and one center post 22. The circuit board 43 having the largest power dissipation is attached to the heat sink 10. This allows heat from the circuit board 43 to be transferred directly to the heat sink 10. Side panels 54 are attached to one cornet post 20 and one center post 22. End panels 52 are attached to two corner posts 20. Circuit boards 42 can be attached to side panels 54 or end panels 52 by means of brackets 41. As shown in FIG. 6 some of the side panels 54 and end panels 52 can be opened to allow easy serviceability of the circuits in the circuit enclosure.

Figure 7:
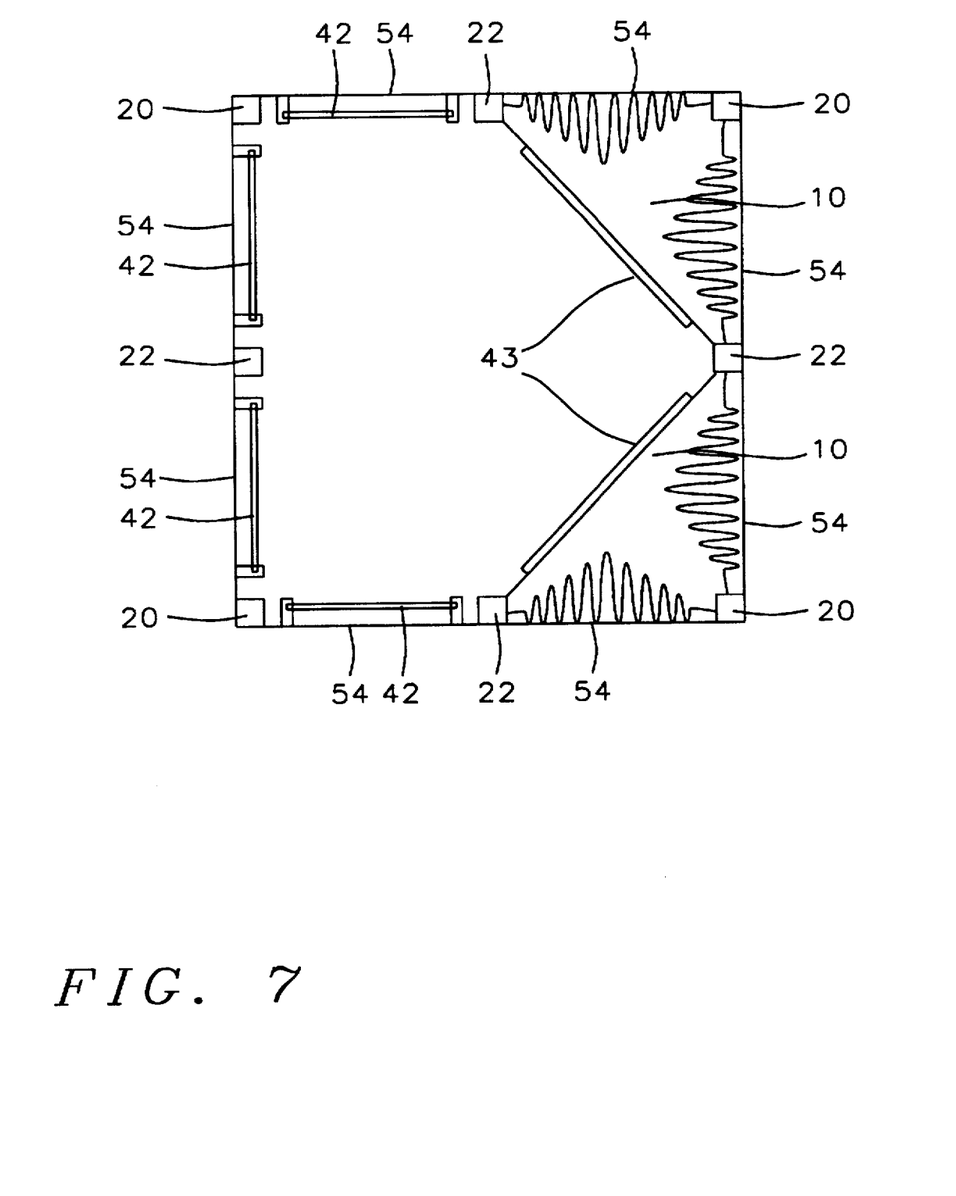
FIG. 7 shows a cross section view of a larger circuit enclosure having two heat sinks.

Another embodiment of the circuit enclosure using two triangular heat sinks 10 is shown in FIG. 7. In this embodiment each heat sink is attached to one corner post 20 and two center posts 22. Circuit boards 43 with higher power dissipation are attached directly to the heat sinks 10. Other circuit boards 42 are attached to the side panels 54 as described in the previous embodiment. As in the previous embodiment the side panels can be easily opened to allow serviceability of the circuits and devices in the circuit enclosure.

While the invention has been particularly shown and described with reference to the preferred embodiments thereof, it will be understood by those skilled in the art that various changes in form and details may be made without departing from the spirit and scope of the invention.

What is claimed is:

1. A circuit enclosure, comprising:
    a bottom enclosure element;
    air inlet means;
    a top enclosure element;
    air outlet means;
    a number of air moving devices;
    four corner posts wherein each said corner post has a first end and a second end, and said first end of each said corner post is attached to said bottom enclosure element, and said second end of each said corner post is attached to said top enclosure element;
    two center posts wherein each said center post has a first end and a second end, said first end of each said center post is attached to said bottom enclosure element, and said second end of each said center post is attached to said top enclosure element;
    a heat sink comprising a spine having a first surface and a second surface wherein a number of cooling fins emanate from said second surface of said spine, each said cooling fin has a tip, the intersection of planes formed by said tips of said cooling fins and said first surface forms a shape having a triangular cross section, and said heat sink is attached to two of said corner posts and one of said center posts;
    four side panels wherein each of said side panels is attached to one of said corner posts and one of said center posts;
    two end panels wherein each of said end panels is attached to two of said corner posts; and
    a control panel attached to one of said side panels or one of said end panels.

2. The circuit enclosure of claim 1 wherein said air moving devices are fans.

3. The circuit enclosure of claim 1 wherein said spine and said cooling fins are metal.

4. The circuit enclosure of claim 1 wherein a circuit board is mounted on said first surface of said spine.

5. The circuit enclosure of claim 1 wherein said side panels, front panel, and back panel are metal.

6. The circuit enclosure of claim 1 wherein said corner posts and said center posts are metal.

7. The circuit enclosure of claim 1 wherein mounting brackets are attached to said corner posts by means of slots formed in said corner posts.

8. A circuit enclosure, comprising:
    a bottom enclosure element;
    air inlet means;
    a top enclosure element;
    air outlet means;
    a number of air moving devices;
    four corner posts wherein each said corner post has a first end and a second end, and said first end of each said corner post is attached to said bottom enclosure element, and said second end of each said corner post is attached to said top enclosure element;
    four center posts wherein each said center post has a first end and a second end, said first end of each said center post is attached to said bottom enclosure element, and said second end of each said center post is attached to said top enclosure element;
    a first heat sink comprising a first spine having a first surface and a second surface wherein a number of first cooling fins emanate from said second surface of said first spine, each said first cooling fin has a tip, the intersection of planes formed by said tips of said first cooling fins and said first surface of said first spine forms a shape having a triangular cross section, and each said first heat sink is attached to two of said center posts and one of said corner posts;
    a second heat sink comprising a second spine having a first surface and a second surface wherein a number of second cooling fins emanate from said second surface of said second spine, each said second cooling fin has a tip, the intersection of planes formed by said tips of said second cooling fins and said first surface of said second spine forms a shape having a triangular cross section, and each said second heat sink is attached to two of said center posts and one of said corner posts so that one of said center posts is attached to said first heat sink and said second heat sink;

eight side panels wherein each of said side panels is attached to one of said corner posts and one of said center posts; and a control panel attached to one of said side panels.

9. The circuit enclosure of claim 8 wherein said air moving devices are fans.

10. The circuit enclosure of claim 8 wherein said spine and said first cooling fins and said second cooling fins are metal.

11. The circuit enclosure of claim 8 wherein a circuit board is mounted on said first surface of said first spine.

12. The circuit enclosure of claim 8 wherein a circuit board is mounted on said first surface of said second spine.

13. The circuit enclosure of claim 8 wherein said side panels are metal.

14. The circuit enclosure of claim 8 wherein said corner posts and said center posts are metal.

15. The circuit enclosure of claim 8 wherein mounting brackets are attached to said corner posts by means of slots formed in said corner posts.

* * * * *